United States Patent [19]

Pearson, Jr.

[11] 4,297,643

[45] Oct. 27, 1981

[54] NOISE OBVIATING ELECTRONIC SIGNAL COUPLING MEANS

[76] Inventor: Thomas J. Pearson, Jr., Rte. 1, Box 18, Coffeeville, Ala. 36524

[21] Appl. No.: 93,541

[22] Filed: Nov. 13, 1979

[51] Int. Cl.³ .............................................. H03F 1/00
[52] U.S. Cl. .................................. 330/178; 330/180
[58] Field of Search ............... 330/178, 180, 302, 306, 330/149; 179/1 P, 1 D

[56] References Cited

U.S. PATENT DOCUMENTS 1,844,177 2/1932 Posthumus .......................... 330/178
3,073,041 1/1963 Haban ................................ 179/1 P

FOREIGN PATENT DOCUMENTS 577462 5/1946 United Kingdom ................ 330/178
637549 5/1950 United Kingdom ................ 330/180

OTHER PUBLICATIONS

R. E. Hanson *Improved Arc/Noise Suppressor* IBM Technical Disclosure Bulletin vol. 22, No. 6, Nov. 1979, p. 2461.

*Primary Examiner*—James B. Mullins
*Assistant Examiner*—Gene Wan
*Attorney, Agent, or Firm*—Walker & McKenzie

[57] ABSTRACT

A coupling network for transferring electronic signals from the output of a first stage to the input of a second stage. The coupling network includes a resistor, a capacitor, and an electronic circuit for connecting the resistor and the capacitor in series between the output of the first stage and the input of the second stage with the resistor positioned between the output of the first stage and the capacitor.

2 Claims, 3 Drawing Figures

NOISE OBVIATING ELECTRONIC SIGNAL COUPLING MEANS

BACKGROUND OF THE INVENTION

1. Field of the Invention.

This invention relates in general to a coupling network or means for an electronic circuit.

2. Description of the Prior Art.

Noise in electronic systems is largely unwanted. The following quote is from pages 9 and 10 of the book *Noise in Electronics* by Courtney Hall (1973):

Small random voltages and currents exist in electrical components and circuits. These fluctuations are referred to as noise because they generally serve no purpose and can interfere with the measurement or detection of useful signals. Such noise sources are inherent in most electronic components and cannot be eliminated. Noise has little importance in electronic systems when signals are very much larger or stronger than the noise. If, however, the signal is very small or weak, the noise may be sufficient to render the signal undetectable. Thus, noise becomes very important when dealing with very low level signals. Noise is the limiting factor in determining the maximum sensitivity of an electronic system.

Various coupling networks have been developed for conveying electronic signals from one stage of an electronic circuit to another stage. For example, a weak audio signal may require several stages of amplification by way of a cascade amplifier or the like to produce the necessary gain in signal strength. The signal is transferred from the output of one stage to the input of the next stage by way of a coupling network or means. A typical coupling means is shown in FIG. 3 of the drawings connecting two triodes and comprising in general a capacitor C electrically coupled between the plate circuit of the first triode T' and the grid circuit of the second triode T". A resistor R is normally used relative to the capacitor for use as the load for one stage across which the output voltage is developed. Such coupling means do not disclose or suggest the present invention. Such prior art amplifier coupling networks are thought by persons skilled in the art to amplify first the inherent noise of the components and then the signals on a logarithmic scale thereby causing a logarithmic gain in the noise.

SUMMARY OF THE INVENTION

The present invention is directed towards providing a coupling network or means for transferring electronic signals from the output of a first stage to the input of a second stage, but at the same time reducing to a minimum any unwanted noises in the signals being transferred. The concept of the present invention is to couple each low level amplifier stage of gain together by way of a network consisting of a resistor and a capacitor mounted, in that order, in series with one another between said stages of gain.

One object of the present invention is to provide such a coupling means which will reduce noise being conveyed from any type of electronic circuit to the following stage thereof by a much greater margin than any prior procedure.

Another object of the present invention is to provide such a coupling means which will have a constant overall impedance for any frequency (i.e., the approximate overall impedance will equal the square root of the sum of the square of the value of the resistor plus the square of the capacitive reactance of the capacitor).

Another object of the present invention is to provide such a coupling means which will suppress "white" noise (i.e., the combination of spurious sounds of all frequencies) until it is almost non-existent.

Another object of the present invention is to provide such a coupling means which will enhance the tone of the signal being conveyed (i.e., such as the "speaker cabinet" enhances the "tone" of the "signals" from the speaker).

Another object of the present invention is by using said coupling, in an amplifier, the overall speaker efficiency is increased (i.e., almost doubled).

DESCRIPTION OF THE PREFERRED EMBODIMENT

Figure 1:
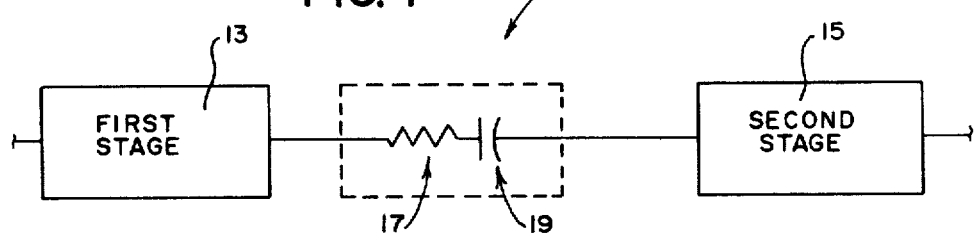
FIG. 1 is a somewhat diagrammatic electrical schematic view of the coupling means of the present invention shown associated with first and second stages.

The coupling network or means 11 of the present invention is for use in transferring an electronic signal from a first stage 13 to a second stage 15. (See, in general, FIGS. 1 and 2). The coupling means 11 comprises, in general, a resistor 17, a capacitor 19, and circuit means for electrically connecting the resistor 17 in series with the capacitor 19 between the output of the first stage 13 and the input of the second stage 15. The resistor 17 must be located in the circuit means between the output of the first stage 13 and the capacitor 19.

Figure 2:
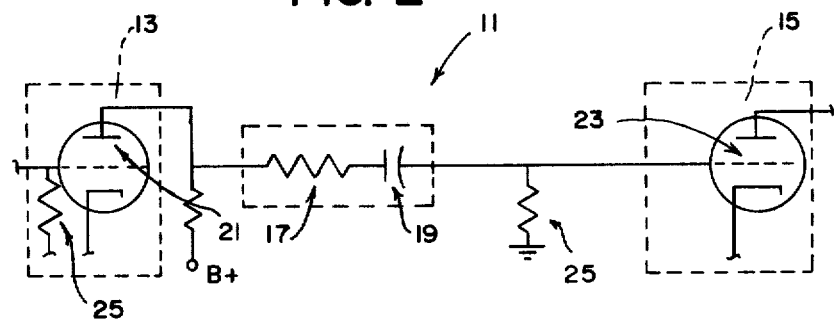
FIG. 2 is a somewhat diagrammatic view of the coupling means of the present invention shown associated with first and second amplifier stages.
Figure 3:
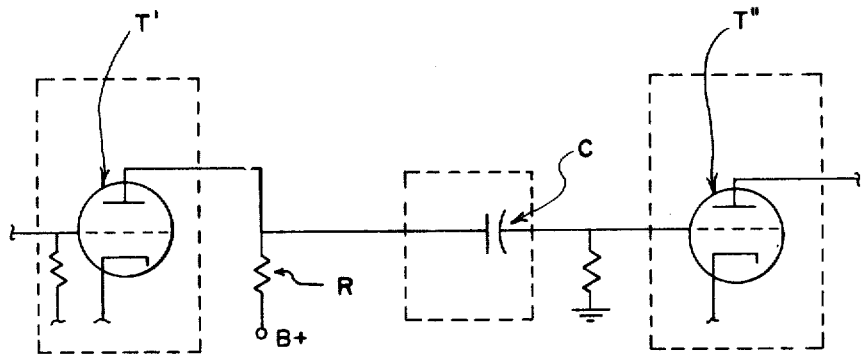
FIG. 3 is a somewhat diagrammatic electrical schematic view of a prior art coupling means shown associated with first and second amplifier stages.

The first and second stages 13, 15 may consist of first and second amplifier stages of a typical and well-known cascade amplifier network as shown in FIG. 2. The coupling means 11 will then be placed between the output, or plate circuit 21, of the first amplifier stage 13 and the input, or grid circuit 23, of the second amplifier stage 15 as clearly shown in FIGS. 2. Each amplifier stage 13, 15 includes a grid leak resistor 25. The resistance of the resistor 17 is preferably $\frac{1}{8}$ to $\frac{1}{4}$ the value of the grid leak resistor 25 of the second amplifier stage 15.

It should be noted that the specific values of the resistor 17 and capacitor 19 may vary. However, the higher the value of the resistor 17 is, the lower the optimum selective frequency of the coupling means 11 will be. More specifically, the frequency of the coupling means is equal to the reciprocal of the product of the value of the resistor 17 times the value of the capacitor 19 times a constant based on the average value of a half-cycle of a sine curve (i.e., approximately 1.264).

As thus constructed and used, the present invention provides means for transferring an electronic signal from one stage to another stage with a maximum of power transfer and a minimum of noise transfer.

Although the invention has been described and illustrated with respect to a preferred embodiment thereof, it is not to be so limited since changes and modifications may be made therein within the full intended scope of the invention.

I claim:

1. An improved coupling means for transferring an electronic signal from the output of any stage of gain to the input of the succeeding stage for obviating the noises as the signal is transferred, said coupling means including a circuit means for extending between the output of the stage of gain and the input of the succeeding stage and capacitor electrically mounted in the circuit means, wherein the improvement comprises: a resistor electrically mounted in the circuit means between the output of the stage of gain and the capacitor with no other electrical components or connections being placed between said resistor and the capacitor, said resistor being in series with the capacitor.

2. A noise obviating coupling means for transferring an electronic signal from the output of a given amplifier stage of a cascade amplifier network to the input of the succeeding amplifier stage of the cascade amplifier network with a maximum of power transfer and a minimum of noise transfer, said coupling means comprising:
   (a) a coupling resistor;
   (b) a capacitor; and
   (c) circuit means for electrically connecting said coupling resistor and said capacitor in series between the output of the given amplifier stage and the input of the succeeding amplifier stage and with no other electrical components or connections being located between said resistor and said capacitor with said resistor positioned between the output of the first amplifier stage and said capacitor.

* * * * *